Nov. 10, 1953 G. L. USSELMAN 2,658,957
DEGENERATIVELY STABILIZED AMPLIFIER CIRCUIT
Filed March 26, 1949
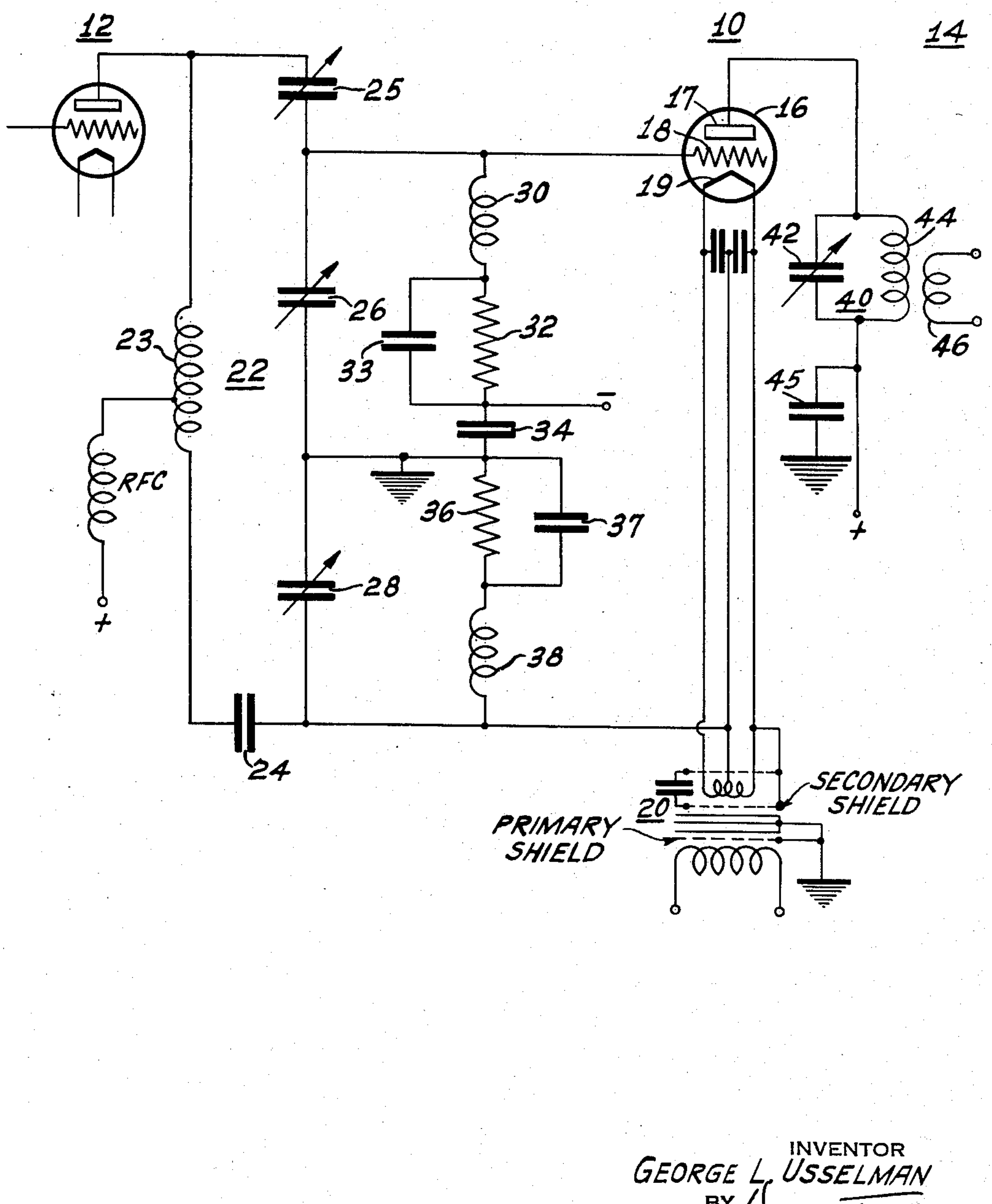
INVENTOR
GEORGE L. USSELMAN
BY Harry Tunick
ATTORNEY Patented Nov. 10, 1953

2,658,957

UNITED STATES PATENT OFFICE 2,658,957

DEGENERATIVELY STABILIZED AMPLIFIER CIRCUIT

George Lindley Usselman, Port Jefferson, N. Y., assignor to Radio Corporation of America, a corporation of Delaware Application March 26, 1949, Serial No. 83,746

9 Claims. (Cl. 179—171)

The invention relates to tuned radio frequency amplifiers, and it particularly pertains to the stabilization of such amplifiers.

It is well known in the prior art to prevent oscillation of tuned radio frequency amplifiers by employing one of the several tried and proven neutralizing circuits which are based on the principle of balancing the feedback paths of the amplifier circuit or by employing the well known grounded-grid amplifier circuit.

Amplifiers neutralized by the prior art schemes are not only critical in adjustment but are actually neutralized over only a comparatively narrow frequency range, which renders the amplifier extremely subject to the generation of parasitic oscillations.

The grounded-grid amplifier is extremely stable due to the fact that it is actually degenerative. However, the stability is achieved only at the cost of supplying a relatively large amount of excitation power, which requirement is highly undesirable to say the least.

It is an object of the invention to provide a tuned radio frequency amplifier which is stable over a wide frequency range.

It is another object of the invention to provide a stable tuned radio frequency amplifier requiring only a moderate amount of driving power.

A further object of the invention is to provide a stable tuned radio frequency amplifier which is readily adjustable.

Still another object of the invention is to provide a tuned radio frequency amplifier which is readily adjustable to be degenerative to a slight degree to insure high stability without requiring an undue amount of excitation power.

These and other objects of the invention which will appear as the specification progresses are achieved in a tuned radio frequency amplifier circuit which has the excitation injected in both the grid and the cathode circuits of an amplifier tube, the excitation components being adjusted to obtain the proper balance of regenerative grid excitation and degenerative cathode excitation to provide an amplifier which is stable over a wide range of frequencies and which is capable of being excited on much less power than is required to drive an equivalent grounded-grid amplifier.

The invention will be described with reference to the accompanying drawing forming a part of the specification and in which the single figure constitutes a schematic diagram of a stable amplifier according to the invention.

Referring to the drawing, there is shown a tuned radio frequency amplifier stage 10 which is excited by a driver stage 12 and is coupled to an output circuit 14. Driver stage 12 and output circuit 14 may be realized in any of the forms well known in the art and will not be further discussed. As shown, amplifier stage 10 includes a triode vacuum tube 16 having an anode 17, a control grid 18, and a filamentary cathode 19, the last of which may be heated by any known means, that shown here being a low capacity filament transformer 20. The output from driver stage 12 is applied to the input circuit of amplifier stage 10 which is constituted by a tank circuit 22 comprising an inductor 23 across which tuning capacitors 25, 26, 28 are connected in series. As shown in the drawing, driver stage 12 is series fed and a D. C. isolation capacitor 24 is preferably interposed between inductor 23 and capacitor 28. However, a shunt fed arrangement may be employed in known manner if desired, in which case capacitor 24, of course, is connected between stage 12 and circuit 22. The junction point between capacitors 25 and 26 is connected to the control grid 18 of tube 16; the junction point between capacitors 26 and 28 is connected to ground; and the junction between capacitor 28 and inductor 23 is coupled in so far as radio frequency currents are concerned to the cathode 19 of tube 16, the actual connections being made to the center tap of the secondary winding of transformer 20. It should be noted at this point that filament transformer 20 is of the type in which the secondary winding has a small radio frequency capacity to ground. An R. F. choke 30, connected in series with a resistor 32, across which is shunted the usual R. F. bypass capacitor 33, is employed to conduct grid current and voltage to grid 18. A capacitor 34 is connected from the lower end of resistor 32 to ground. Likewise, a radio frequency choke 38, connected in series with a resistor 36, across which is shunted another bypass condenser 37, is employed to conduct cathode current and voltage. Anode 17 of tube 16 is connected to an output tank circuit 40 comprising an inductor 44 shunted by a variable capacitor 42 in the usual manner. The output voltage produced of amplifier stage 10 may be transferred to output circuit 14 by any known means, that shown here being an inductive link 46.

In operation, output tank circuit 40 is tuned in the normal manner and need not be further discussed. Input tank circuit 22 is roughly tuned to resonance at the desired frequency by adjustment of capacitors 25, 26, and 28. Capacitors 26 and 28 are then adjusted to produce the desired balance of regenerative and degenerative excitation producing normal grid current in tube 16 for the operating potentials applied thereto, after which capacitor 25 is readjusted to retune tank circuit 22 to the desired frequency if it is found that the adjustment of capacitors 26 and 28 has detuned tank circuit 22. It should be noted that the phase of the R. F. excitation voltages applied to the grid and the cathode should have 180 degree phase relation for best operation. This is realized in the circuit by connecting the grid and the cathode of tube 16 on opposite sides of ground point. This anti-phase (180° phase) relationship does not prevent oscillation per se, but the anode current (pulses) bucks or opposes the excitation applied to the cathode and the amplifier is stabilized. In other words, when the cathode excitation voltage drives the cathode negative, a pulse of anode current will flow. This pulse of positive anode current to the cathode and through its excitation impedance circuit drives the cathode potential in a positive direction. Thus it opposes, to a large extent, the negative excitation voltage impressed on the cathode at this instant, and in general causes degeneration.

In adjusting amplifier stage 10, it should be remembered that if excessive excitation voltage is injected in the grid circuit and not enough is injected in the cathode circuit, the amplifier will tend to be unstable and may oscillate when driver power is interrupted. If excessive excitation voltage is injected in the cathode circuit, the amplifier will be stable but the amplifier will require an excessive amount of driving power. By proper adjustment of capacitors 26 and 28, a condition will be obtained where the amplifier operates stably and requires only a moderate amount of driving power.

It may be well to note at this point that if the capacity of capacitor 28 is increased to a very large value, amplifier stage 10 will oscillate since it then is equivalent to an unneutralized amplifier. If the capacity of capacitor 26 is increased to a very large value, the amplifier stage 10 will be extremely stable but will require more than the normal amount of excitation power, since the amplifier will then be equivalent to a grounded-grid amplifier.

Although the amplifier circuit can be adjusted for substantially complete neutralization, it is preferably adjusted so that it is slightly degenerative, under which condition the amplifier will be extremely stable although it will require that slightly more excitation power be applied.

While the invention has been described in terms of a single express embodiment, it is to be understood that obvious modifications thereto and applications of the underlying principles of the invention to known arrangements will be suggested to any one skilled in the art without departing from the spirit and scope of the invention.

I claim:

1. An amplifier circuit arrangement including a triode vacuum tube having an anode, a control grid and a cathode, an output tank circuit coupled to said anode, an input tank circuit comprising first, second and third capacitors connected in series and an inductor coupled across said series connected capacitors, means to couple said control grid to the junction between said first and second capacitors, means to couple the junction between said second and third capacitors to a point of reference potential, means to connect said third capacitor to said cathode, and means to apply operating potentials to said amplifier circuit.

2. An amplifier circuit arrangement including a vacuum tube having at least an anode, a control grid and a cathode, a tuned output tank circuit coupled to said anode, an input tank circuit comprising first, second and third variable capacitors connected in series and an inductor coupled across said series connected capacitors, means to couple said control grid to the junction between said first and second variable capacitors, means to couple the junction between said second and third capacitors to a point of reference potential, means to connect said third variable capacitor to said cathode, and means to apply operating potentials to said amplifier circuit.

3. An amplifier circuit arrangement including a triode vacuum tube having an anode, a control grid and a cathode, an input tank circuit comprising three variable capacitors connected in series and an inductor coupled across said series connected variable capacitors, a connection between one of said variable capacitors and said cathode, a ground lead from the junction between said one variable capacitor and the next adjacent variable capacitor, a connection from the junction between said next adjacent variable capacitor and the remaining capacitor to the control grid of said tube, grid bias connections comprising a choke connected in series with a resistor between said cathode and ground and another choke connected in series with another resistor between said control grid and a point of negative potential, and an output circuit connected to said anode.

4. An amplifier circuit arrangement including a triode vacuum tube having an anode, a control grid and a filamentary cathode, an input tank circuit comprising three variable capacitors connected in series and an inductor coupled across said series connected variable capacitors, a connection between one of said variable capacitors and said cathode, a ground lead from the junction between said one variable capacitor and the next adjacent variable capacitor, a connection from the junction between said next adjacent variable capacitor and the remaining capacitor to the control grid of said tube, connections comprising a choke and a resistor connected in series between said cathode and ground, connections comprising another choke and a resistor connected in series between said control grid and a point of negative potential, a further capacitor between said point of negative potential and ground, and an output circuit connected to said anode.

5. An amplifier circuit arrangement including a triode vacuum tube having an anode, a control grid and a filamentary cathode, a filament heating transformer having a center-tapped secondary winding connected to said filamentary cathode, said transformer having a low capacity to ground at the frequency of operation, capacitors coupling the center tap of said secondary winding to each end of said filamentary cathode at the frequency of operation, an input tank circuit comprising three variable capacitors connected in series and an inductor, a blocking capacitor coupling said conductor across said series connected variable capacitors, a connection between said center tap and the junction between said blocking capacitor and one of said variable capacitors, a ground lead from the junction between said one variable capacitor and the next adjacent variable capacitor, a connection from the junction between said next adjacent variable capacitor and the remaining capacitor to the control grid of said tube, connections comprising a choke connected in series with a parallel resistor and capacitor combination between said center tap and ground, connections comprising another choke connected in series with another parallel resistor and capacitor combination between said control grid and a point of potential negative with respect to said cathode, a further capacitor between said point of negative potential and ground, and an output circuit connected to said anode.

6. An amplifier circuit arrangement including a vacuum tube having at least a cathode, a control grid and an anode, a resonant input circuit comprising two capacitors, an inductor, and separate tuning means all connected in series to form therewith a single series circuit, the junction between said capacitors being directly connected to a point of fixed reference potential, the other terminal of one of said capacitors being connected to said control grid and the remaining terminal of the other capacitor being directly connected to said cathode.

7. In an amplifier circuit arrangement including a controlled electron path device having at least a control electrode and a cathode electrode, a resonant input circuit comprising an inductive reactance element, a capacitive reactance element, a further capacitive reactance element and separate tuning means all coupled in a single series circuit relationship, means connecting said inductive reactance element for alternating current to said further capacitor reactance element, means coupling said control electrode to one of said capacitive reactance elements, means establishing the junction between said capacitive reactance elements directly at a fixed reference voltage level, and means connecting said cathode electrode directly to the junction between said alternating current connecting means and the other capacitive reactance elements.

8. In an amplifier circuit arrangement including a controlled electron path device having at least a control electrode and a cathode electrode, an input circuit comprising an inductive reactance element, three capacitive reactance elements connected in series circuit relationship and means connecting the third capacitor reactance element for alternating current to said inductive reactance element, means coupling said control electrode to the junction between the first and second of said capacitive reactance elements, means establishing the junction between said second and third capacitive reactance elements directly at a fixed reference voltage level, and means connecting said cathode electrode directly to the junction between said alternating current connecting means and the third capacitive reactance element.

9. In an amplifier circuit arrangement including a controlled electron path device having at least an electron flow control electrode, an electron emitter electrode and an electron collector electrode, a resonant output circuit connected to said collector electrode, a resonant input circuit comprising a reactive element of given sign, at least another reactive element, a further reactive element of opposite sign and separate means for tuning said input circuit all connected in a single series-circuit relationship, means connecting the first said reactive element for alternating current to said further reactive element, means coupling said control electrode to said other reactive element, means establishing the junction between said other and said further reactive elements directly at a fixed reference voltage level, and means connecting said emitter electrode directly to the junction between said alternating current connecting means and said further reactive element.

GEORGE LINDLEY USSELMAN.

References Cited in the file of this patent

UNITED STATES PATENTS

| Number | Name | Date |
|---|---|---|
| 1,925,568 | Roberts | Sept. 5, 1933 |
| 1,925,569 | Roberts | Sept. 5, 1933 |
| 2,045,700 | Dalpayrat | June 30, 1936 |
| 2,155,025 | Tellegen et al. | Apr. 18, 1939 |
| 2,255,882 | Hathaway | Sept. 16, 1941 |
| 2,282,381 | Root | May 12, 1942 |
| 2,302,798 | Percival | Nov. 24, 1942 |
| 2,304,978 | White | Dec. 15, 1942 |
| 2,404,809 | O'Brien | July 30, 1946 |

FOREIGN PATENTS

| Number | Country | Date |
|---|---|---|
| 445,098 | Great Britain | Apr. 2, 1936 |